United States Patent
Reiss et al.

(10) Patent No.: US 7,309,525 B2
(45) Date of Patent: Dec. 18, 2007

(54) INORGANIC NANOCRYSTALS WITH ORGANIC COATING LAYER, THEIR METHOD OF MANUFACTURE AND MATERIALS CONSTITUTED BY SAID NANOCRYSTALS

(75) Inventors: Peter Reiss, Saint Egrève (FR); Claudia Querner, Grenoble (FR); Nicolas Charvet, Voreppe (FR)

(73) Assignee: Commissariat l'Energie Atomique, Paris (FR)

( * ) Notice: Subject to any disclaimer, the term of this patent is extended or adjusted under 35 U.S.C. 154(b) by 247 days.

(21) Appl. No.: 11/000,525

(22) Filed: Dec. 1, 2004

(65) Prior Publication Data
US 2005/0266246 A1 Dec. 1, 2005

(30) Foreign Application Priority Data
Dec. 2, 2003 (FR) ................................. 03 50954

(51) Int. Cl.
*B32B 5/16* (2006.01)
(52) U.S. Cl. ........................ 428/403; 977/813; 977/830
(58) Field of Classification Search ................ 428/403, 428/570, 407; 977/773, 813, 830
See application file for complete search history.

(56) References Cited
U.S. PATENT DOCUMENTS

| | | | | |
|---|---|---|---|---|
| 5,990,479 A | * | 11/1999 | Weiss et al. ................ | 250/307 |
| 6,251,303 B1 | * | 6/2001 | Bawendi et al. ...... | 252/301.4 R |
| 6,444,143 B2 | * | 9/2002 | Bawendi et al. ...... | 252/301.6 S |
| 6,649,138 B2 | * | 11/2003 | Adams et al. ............... | 423/403 |
| 6,949,206 B2 | * | 9/2005 | Whiteford et al. .......... | 252/500 |
| 6,955,855 B2 | * | 10/2005 | Naasani ...................... | 428/403 |
| 7,101,718 B2 | * | 9/2006 | Weiss et al. ................. | 436/524 |
| 7,108,915 B2 | * | 9/2006 | Adams et al. .............. | 428/403 |

* cited by examiner

*Primary Examiner*—H. T Le
(74) *Attorney, Agent, or Firm*—McKenna Long & Aldridge LLP

(57) ABSTRACT

Nanocrystal comprising an inorganic core consisting of least one metal and/or at least one semi-conductor compound comprising at least one metal, the external surface of said nanocrystal being provided with an organic coating layer, consisting of at least one ligand compound of formula (I):

$$X\text{—}Y\text{-}Z \quad (I)$$

Figure 1A:
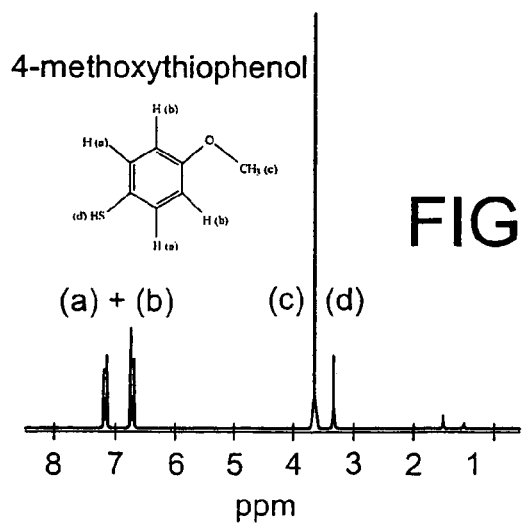
Figure 1B:
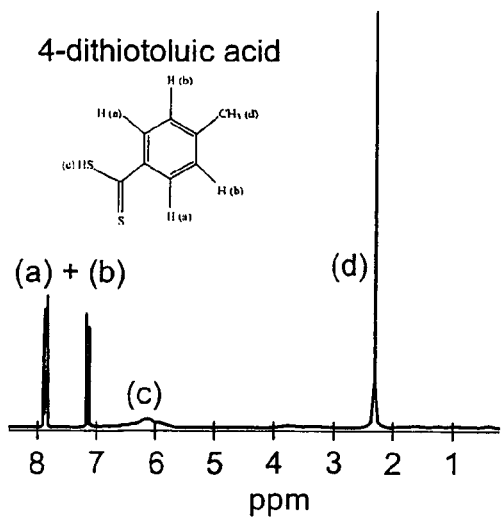

in which
X represents a 1,1-dithiolate or 1,1-diselenoate group that is linked by the two atoms of sulphur or selenium to an atom of metal of the external surface of said nanocrystal;
Y represents a spacer group, such as a group capable of allowing a transfer of charge or an insulating group;
Z is a group chosen from among groups capable of communicating specific properties to the nanocrystal.

Their methods of manufacture.

38 Claims, 4 Drawing Sheets

INORGANIC NANOCRYSTALS WITH ORGANIC COATING LAYER, THEIR METHOD OF MANUFACTURE AND MATERIALS CONSTITUTED BY SAID NANOCRYSTALS

TECHNICAL FIELD

The invention concerns inorganic nanocrystals that are provided with an organic coating layer and the materials constituted by said nanocrystals.

More precisely, the invention concerns materials consisting of nanocrystals consisting of least one metal and/or at least one semi-conductor compound comprising at least one metal, and may comprise a shell consisting of one or several layers of a metal and/or at least one semi-conductor compound comprising at least one metal, in which the external surface of said nanocrystals is provided with and coated by an organic coating layer, in particular a layer of ligands such as chelate ligands intended, in particular, to assure the stabilisation of said nanocrystals.

In the case where they comprise one (or several) shells, the nanocrystals are instead called "core/shell" nanocrystals. In particular, the invention concerns luminescent materials consisting of nanocrystals comprising a semi-conductor core A(II) B (VI), preferably surrounded by a shell, and an organic coating layer. More precisely, the invention concerns nanocrystals with a core of CdSe covered by a shell of ZnSe and by an organic coating layer.

The invention further concerns a method for preparing said nanocrystals and materials.

The technical field of the invention may be defined in a general manner as that of inorganic nanocrystals, more precisely that of nanocrystals consisting of at least one metal and/or at least one semi-conductor compound, said semi-conductor compound comprising at least one metal.

The nanocrystals may be defined as "nanometric" crystalline objects, in other words, their size is generally less than 150 Å and preferably in the range from 12 to 150 Å.

The inorganic nanocrystals find application in numerous sectors.

A large number of applications for inorganic nanocrystals and particularly semi-conductor nanocrystals is based on their capacity to emit light. Such fluorescent semi-conductor nanocrystals may be used, for example, as fluorescent markers for chemical or biological molecules or in electroluminescent devices.

In order to obtain an emission in the visible spectrum, one mainly works with semi-conductor nanocrystals with a small forbidden gap by profiting from the fact of being able to choose, for a given material, the colour emitted as a function of the size of the nanocrystals.

Luminescent semi-conductor nanocrystals generally consist of semi-conductors of formula A (II) B (IV), in which A represents a metal or a non metal in oxidation state +II and B represents a chemical element, such as a metal or a non metal, in oxidation state −II.

The semi-conductor crystals A (II) B (VI) such as, for example, ZnS, ZnSe, CdS, CdSe or CdTe are materials that have been known for their photoluminescence properties for several decades.

In the 1980s and 1990s, it was shown that their absorption and emission spectra depend on the size of the crystal when the said crystal becomes sufficiently small. For crystals whose size is approximately in the range from 1 to 10 nm, which are then called "nanocrystals" or "quantum dots", this dependency is extremely pronounced (Angew. Chem. Int. Ed. Engl., 32, pages 41-53, (1993)).

Consequently, the entire range of colours in the visible and near infrared and ultraviolet may be obtained with semi-conductor nanocrystals A (II) B (IV) by the appropriate choice of their size and composition.

Generally, the optical quality of a luminescent material made of nanocrystals depends on several parameters, the most important of which are:

the size of the nanocrystals, which governs the wavelength of the emission and therefore the colour emitted, as already indicated;

the size distribution of the nanocrystals, which controls the width of the emission band;

the passivation of the surface of the nanocrystals, which is responsible for the fluorescence quantum efficiency.

Several methods for preparing nanocrystals A (II) B (I) exist:

The first methods for preparing these crystals were developed in aqueous media (J. Am. Chem. Soc., 109, pages 5649-5655 (1987); J. Phys. Chem., 98, pages 7665-7673 (1994)) or in water/organic medium mixtures: this includes, for example, the method called "inverse micelles"—(Langmuir, 13, pages 3266-3276 (1997)).

These aqueous synthesis routes to semi-conductor nanocrystals A (II) B (VI) nevertheless lead to samples in which the reduced luminescence efficiency and the wide spectral width are major technological disadvantages.

It is for these reasons that other preparation methods have been developed.

The article of the J. Am. Chem. Soc., 115, pages 8706-8715 (1993) thus describes an organometallic synthesis route to CdB nanocrystals (where B=S, Se, Te). The principal advantage of this organometallic method compared to the above-mentioned methods in aqueous media resides in the fact that the nanocrystals prepared in this way have a better size distribution, which is generally less than 10%.

This size distribution leads to a much narrower emission spectrum, which is obviously an advantage for technological applications. The principal organometallic synthetic routes for the preparation of CdSe nanocrystals are as follows:

the conventional organometallic synthesis route consists in reacting dialkyl cadmium, preferably dimethyl or diethyl cadmium with selenium, both dispersed in trioctyl phosphine (TOP); this dispersion is injected into trioctyl phosphine oxide (TOPO) at high temperature", which acts as a reactive medium. This synthesis is described in the document J. Am. Chem. Soc., 115, pages 8706-8715 (1993);

a modification of the previous synthesis method has been described in the document Nanoletters, 1(4), pages 207-211 (2001). In this method, the reactive medium, instead of TOPO, is a mixture of TOPO and hexadecyl amine (HDA). The authors bring an improvement to the width of the size distribution, which is around 5%.

another modification has been proposed by Z. A. PENG and X. PENG in the document J. Am. Chem. Soc., 123, pages 183-184 (2001); these authors describe an inorganic/organometallic synthesis route to CdB nanocrystals (where B is Se, S or Te) in which they replace the pyrophoric and toxic dialkyl cadmium compounds by cadmium oxide (CdO) complexed by an alkyl phosphonic acid. The principal advantage of this method is that CdO constitutes a source of cadmium that is a lot less reactive and easier to handle than dialkyl cadmium compounds. Another advantage is that the nanocrystals prepared in this way have a very narrow size distribution, generally less than 10%, which leads to a narrow emission spectrum with a band width at mid height of around 30 nm.

The above-mentioned preparation methods do not resolve the problem of fluorescence quantum efficiency, which remains low, i.e. typically between 5 and 10% for CdSe crystals.

In the article J. Phys. Chem., 100, pages 468-471 (1996), a method for increasing this efficiency is proposed. It consists in passivating nanocrystals that are in CdSe, in this case, by growing around this "core" a shell of a second semi-conductor with a wider forbidden gap than the core, said semi-conductor consisting of ZnS. This system is called "core/shell" in the scientific literature. The methods used for depositing the shell are essentially the same as those used for the preparation of the core. The deposition of a shell of ZnS is achieved, for example, with the highly reactive compounds diethyl zinc and bis(trimethyl silyl) sulphide. After growing the shell, the authors observed an increase in the fluorescence quantum efficiency to values between 10 and 50%, or even above 50%, at ambient temperature.

M. G. BAWENDI et al. describe the preparation of this same type of CdSe/ZnS core/shell nanocrystals in the article J. Phys. Chem. B, 101, pages 9463-9475 (1997) and the patents U.S. Pat. No. 6,207,229 and WO 99/26299.

The article J. Am. Chem. Soc., 119, pages 7019-7029 (1997) describes the preparation of CdSe/CdS core/shell nanocrystals. The authors report an increase in the fluorescence quantum efficiency at ambient temperature up to a value of at least 50%.

The document of P. REISS et al., Nano Lett. 2(7), p. 781-783 (2002) shows that with the CdSe/ZnSe core/shell system in which the surface is provided with an organic passivation layer consisting of at least one primary amine such as hexadecyl amine (HDA) associated with at least one phosphine oxide compound such as TOPO, and/or a phosphine selenide, efficiency values of 60 to 85% are attained. The same nanocrystals and their synthesis in a solvent associating, for example, HDA and TOPO are described in the French patent application FR-A-2 838 241.

It emerges from what has been stated that among the methods known to the prior art, the inorganic/organometallic synthesis method makes it possible to prepare semi-conductor A (II) B (VI) nanocrystals with the best optical properties. Indeed, the nanocrystals prepared in this way, thanks to their narrow size distribution, have narrow emission band widths and the core/shell systems have high fluorescence quantum efficiency values (FR-A 2 838 241).

In the field of biological marking, the semi-conductor nanocrystals could replace the organic colorants presently used as fluorescent markers, with the principal advantage of better resisting ageing under light beams (M. Bruchez et al., Science 281, p. 2013-2015 (1998)).

However, this application requires, a priori, an exchange of organic molecules stemming from the inorganic/organometallic synthesis that are found on the surface of the nanocrystals for the following reasons:

1) the molecules present on the surface of the nanocrystal confer it with a hydrophobic character, which precludes its use in a physiological medium, in other words, an essentially aqueous medium.

2) said molecules do not allow an organic bond with the biological molecules that one wishes to mark.

The molecules in question are surfactants, for example of the trialkyl phosphine type such as TOP, trialkyl phosphine oxide such as TOPO, alkyl phosphonic acid, carboxylic acid or alkyl amine, which are linked by their polar heads to the surface of the crystal, whereas their alkyl chains form a hydrophobic layer towards the exterior. Thus, in the document FR-A-2 838 241 already cited above, a layer formed by the association of a primary amine and a phosphine oxide or phosphine selenide compound is formed at the surface of the nanocrystals.

One possibility of making the nanocrystals hydrosoluble and allowing their bonding with biological molecules is to exchange the molecules at their surface with bi-functional ligands. Said ligands have both a function with an affinity for the surface of the nanocrystals and a function that allows the solubilisation of the nanocrystals in water and/or to bond with a biological molecule (W. C. W. Chan et al., Science 281, p. 2016-2018 (1998)).

Another application of semi-conductor nanocrystals that is not based on their photoluminescence properties is their incorporation in conjugated polymer or oligomer films with the aim of obtaining new materials for light—electricity conversion for photovoltaic effect in solar cells. The nanocrystals play the role of absorbers of sunlight and conveyors of electrons to the electrodes (W. U. Huynh et al., Science 295, p. 2425 (2002)).

The efficiency of these materials is presently limited by the difficulties of controlling their morphology; they are made by mixing two constituents, namely on the one hand nanocrystals and on the other hand a conjugated polymer, which leads to a phenomenon of segregation of phases into polymer rich zones and nanocrystal rich zones. Moreover, the interface between the two constituents is not controlled, which prevents the optimisation of the transfer of charge carriers and reduces the efficiency of the material. One possibility for improvement consists in grafting, by forming a chemical bond, the polymer onto the nanocrystal. In this way, the segregation of the phases can be avoided and the interface between the nanocrystals and the polymer is better defined. This approach has been used in practice recently in the document of D. J. Milliron et al., Adv. Mater. 15(1), p. 58 (2003) in which the conjugated oligomer is chemically modified in order to introduce a function that makes it possible to graft it onto the nanocrystal. However, the proposed method requires a multi-step organic synthesis, which is difficult to adapt to a large number of different conjugated polymers/oligomers.

On the other hand, the design of the bifunctional ligands that serve as linking molecules between the nanocrystal on the one hand and the polymer/oligomer on the other hand, gives a lot more flexibility with regard to the choice of materials, because it is not necessary to change the well established preparation routes of the polymers or oligomers.

These ligands of the type X—Y-Z bear a function X with a strong affinity for the surface of the nanocrystals, a group called a "spacer" Y, which may be conjugated or unconjugated and a function Z, which allows the bond with the polymer/oligomer.

It stems from what precedes that the potential applications of nanocrystals require, firstly, an exchange of organic molecules at their surface by bifunctional ligands X—Y-Z, which enables a dispersion in water or the grafting to other molecules.

The type of bifunctional ligand used presently in most examples of the literature contain one or several thiol groups (—SH) as anchoring function X for the bond with the surface of the nanocrysta and one could in this respect refer to the articles of W. C. W. Chan et al., Science 281, p. 2016-2018 (1998), and of S. F. Wuister et al., Nano Lett. 3(4), p. 503-507 (2003).

The nanocrystals functionalised by the thiols in order to render them hydrosoluble are, for example, the subject of the patent application WO 00/17656 of the 30 Mar. 2000.

However, the publication J. Am. Chem. Soc. 123(36), p. 8844-8850 (2001) shows that the CdSe nanocrystals with thiols at the surface are sensitive to the phenomenon of photo-oxidation. Under UV irradiation, the thiols detach from the surface, forming disulphides. Thus, the organic layer that protects the colloidal nanocrystal disappears, which leads to its precipitation. This process is observed for all types of thiol ligands and a comparison of the stability shows that thiols bearing long alkyl chains are more stable than short chain thiols and aromatic thiols. This study also shows that the stability of the ligands with several thiol groups on the surface of the nanocrystals is not higher than that of monothiols. The phenomenon of photo-oxidation, which leads to a desorption of the thiol ligands, is not limited to the semi-conductor nanocrystals; gold nanocrystals are another important example because thiols are the ligands most often used for their functionalisation.

In conclusion, one can note that the thiol ligands presently used for the functionalisation of nanocrystals are not photostable, which considerably restricts the applications of the nanocrystals modified in this way. The problems particularly resides in the anchoring function (—SH), which does not provide a sufficiently stable bond with the surface of different types of nanocrystals.

Other documents concerning functionalised nanocrystals are the documents U.S. Pat. No. 5,990,479 (of the 23 Nov. 1999), the document U.S. Pat. No. B2-6,444,143 (of the 3 Sep. 2002) and the document WO-A-02/073155 (of the 19 Sep. 2002).

The document U.S. Pat. No. A-5,990,479 concerns luminescent semi-conductor nanocrystals that are linked to an affinity molecule by means of a linking agent.

The affinity molecule is capable of linking to a detectable substance, and the nanocrystal can then play the role of probe, particularly in biological applications to detect the presence of said substance in a material.

The affinity molecule is chosen, for example, from among ligands and the linking agent is, for example, N-(3-aminopropyl-3 mercapto-benzamide) thiol.

The document U.S. Pat. No. B2 6,444,143 describes fluorescent nanocrystals soluble in water, preferably with a core/shell structure, which comprise an external layer comprising a compound having at least one linking group to anchor the compound to the surface of the nanocrystal and at least one hydroxyl group separated from the linking group by a region sufficiently hydrophobic to prevent charge transfers through it.

To prepare the nanocrystals, conventional ligands such as TOPO found at the surface of the nanocrystals are replaced by other ligand compounds that may be bidentate or tridendate ligands bearing several linking groups such as thiols; the compound can thus be a dithiol such as dihydrolipoic acid.

Dithiolate complexes are not cited in this document.

The document WO-A-02/073155 also describes semiconductor nanocrystals with a core/shell structure that are provided with an agent for solubilisation in water chosen in particular among the hydroxamates, or derivatives of hydroxamic acid; multidentate complexing agents; a bilayer consisting of a layer of TOPO fixed to the surface of the nanocrystal and a surfactant layer; a molecule containing several anchoring groups meeting the very general formula $(R^1)a\ —R^2—[(R^3)_b(R^4)_c]_d$ in which $R^1$ may, among 18 possibilities, represent —C(S)SH, no specific example of a molecule of this type being mentioned.

No information concerning the stability of the bond of these molecules to the surface of the nanocrystals is given.

Moreover, the nanocrystals claimed in the document WO-A-02/073155 are exclusively hydrosoluble nanocrystals; whereas, in the present invention, the ligands X—Y-Z (see below) confer to the nanocrystals specific properties, which are not limited to their hydrosolubility.

In addition, the nanocrystals claimed in the document WO-A-02/073155 are exclusively semi-conductor nanocrystals with a semi-conductor shell, whereas the present invention also concerns metallic nanocrystals, semi-conductor nanocrystals without a shell and nanocrystals with multiple shells.

It should be noted that in the latter two documents cited, the ligands that cover the nanocrystals necessarily have hydrophilic functions in order to render them soluble in water.

It is important to mention that there are a large number of applications of nanocrystals, especially outside of the field of biological marking, which does not require them to be hydrosoluble.

With regard to the study carried out above, it appears that there exists a need for functionalised nanocrystals that have an improved stability, particularly a colloidal stability, compared to nanocrystals functionalised by the ligands described in the documents of the prior art and especially compared to nanocrystals functionalised by thiol ligands, which are the most widely used.

Furthermore, there exists, in a general manner, a need for nanocrystals that have a wide range of properties, which are luminescent or not luminescent, soluble in water or in other solvents and in which the structure, particularly the functionalisation, assures a wide range of properties.

In particular, there exists a need for nanocrystals functionalised by ligands that have improved photostability, particularly to ultraviolet. In the case of photoluminescent nanocrystals, there is a need for nanocrystals in which the photoluminescence properties are conserved for a long period.

Furthermore, such crystals with improved stability must be able to be prepared by a simple, reliable and trustworthy method that comprises a limited number of steps. In the same way, the ligands must be able to be prepared by a simple, reliable and flexible method that assures access to a wide variety of structures.

The aim of the invention is to provide nanocrystals that meet, among other things, the above-mentioned needs and satisfy the requirements and criteria cited above.

A further aim of the invention is to provide nanocrystals that do not have the drawbacks, defects, limitations and disadvantages of nanocrystals of the prior art and which resolve the problems posed by the nanocrystals of the prior art.

This aim, and others, are attained according to the invention by a nanocrystal comprising an inorganic core consisting of least one metal and/or at least one semi-conductor compound comprising at least one metal, the external surface of said nanocrystal being provided with an organic coating layer, consisting of at least one ligand compound of formula (I):

$$X—Y\text{-}Z \qquad (I)$$

in which

X represents a 1,1-dithiolate or 1,1-diselenoate group that is linked by the two atoms of sulphur or selenium to an atom of metal of the external surface of said nanocrystal;

Y represents a spacer group, such as a group capable of allowing a transfer of charge or an insulating group;

Z is a group chosen from among groups capable of communicating specific properties to the nanocrystal.

The nanocrystals according to the invention differ fundamentally from the nanocrystals of the prior art by the fact that the organic coating layer with which the external surface of the nanocrystal is provided, which one may define as a layer of ligands, comprises specific compounds or ligands of formula (I), in which the group X, which assures the link of the ligand with the surface of the nanocrystal is, specifically, according to the invention, a 1,1-dithiolate or 1,1-diselenoate group.

These groups assure a strong bond with the surface of the nanocrystals, whether they are semi-conductors or metallic.

This bond is much stronger than with the ligands of the prior art and particularly thiol ligands, and multidentate ligands such as dithiols. The stability of the nanocrystals according to the invention is consequently considerably improved compared to stabilised nanocrystals functionalised by different ligands.

It appears that each ligand molecule (I) links preferably by the two atoms of sulphur or selenium of the group X on the same atom of metal at the surface of the nanocrystal, thus forming a ring with four atoms and acting as a bidentate chelate ligand.

That a bond with such force and such an improvement in the stability can be obtained with the specific dithiolate or diselenoate ligands according to the invention cannot in any way be foreseen by the prior art.

The nanocrystals of the invention meet all of the needs listed above and provide a solution to the problems of nanocrystals of the prior art and, in particular, nanocrystals in which the ligands are linked to the external surface of the nanocrystal by thiol or dithiol groups.

In other words, the principal advantages of the nanocrystals according to the invention are, among other things:

very easy to prepare, for example through a simple substitution of the ligands already present at the surface of the nanocrystals by the ligands (I) characteristic of the invention, due to the high affinity of said ligands for the metal atoms;

a high colloidal stability of the covered nanocrystals, coated by chelate ligands (I) thanks to their strong bond with the atoms of metal at the surface of the nanocrystals;

a much improved resistance to photodegradation compared to the nanocrystals of the prior art;

photoluminescence properties also preserved longer than with the nanocrystals of the prior art and in particular with the nanocrystals covered by thiol ligands, particularly in the case of core/shell nanocrystals.

The properties of the nanocrystals can easily be adapted and modified thanks to the great flexibility that exists in the choice of the spacer Y (which may be conjugated or non conjugated, contain or not heteroatoms, etc.) and the Z group. This flexibility particularly stems from the fact that the chelating ligand compounds (I) may be prepared by simple synthetic routes.

The function Z may thus make it possible to render the nanocrystals soluble in solvents of varied polarity such as hydrocarbons, alcohols, water and mixtures thereof. Moreover, the function Z may enable the link with other molecules such as biological molecules, conjugated polymers, etc.

Finally, it should be noted that the effects and advantages of the nanocrystals of the invention are not limited to semi-conductor nanocrystals A (II)/B (VI) but are also shown by other semi-conductors or other metals, whether these crystals are simple nanocrystals or core/shell nanocrystals.

Indeed, the advantages and effects of the nanocrystals of the invention are linked in an inherent manner to the specific nature of the ligand compounds (I) and not to the nature of the nanocrystal or its structure.

The nanocrystal provided with an organic coating layer consisting of ligands (I) according to the invention may be a fluorescent, photoluminescent nanocrystal.

The fluorescent, photoluminescent nanocrystal may have been subjected to an irradiation by a light, preferably an ultraviolet light.

In a surprising manner, the luminescent, photoluminescent crystals, which have been subjected to such light irradiation, preferably by an ultraviolet light, have an enhanced and improved fluorescence, photoluminescence efficiency and intensity, which is due to a photochemical process.

The invention further concerns a method for preparing nanocrystals as described above.

In a first embodiment, the method for preparing nanocrystals as described above comprises the following successive steps:

a) One prepares a solution, in a solvent, of nanocrystals having an inorganic core consisting of at least one metal and/or at least one semi-conductor compound comprising at least one metal and that may optionally comprise one or several shell(s) surrounding said core, said shell(s) (each) consisting of a layer of a metal and/or at least one semi-conductor compound comprising at least one metal, the external surface of said nanocrystal being provided with an organic coating layer consisting of at least one first ligand compound different to the ligand compound of formula (I);

b) One adds to the solution of step a) ligand compounds of formula (I) soluble in the solvent of said solution of step a) in such a way that the ligand compounds of formula (I) are in excess in relation to the first ligand compounds different to the ligand compound of formula (I) with which the nanocrystals are provided;

c) One leaves the ligand compounds of formula (I) and the nanocrystals in contact, preferably under agitation, for sufficient time to achieve, at the surface of the nanocrystals, an essentially total exchange of the first ligand compounds by the ligand compounds of formula (I).

By excess, in step b), is generally meant that the molar ratio of the ligand compounds of formula (I) added to the first ligand compounds is, for example, from 5:1 to 15:1.

In general, in step b), the compounds of formula (I) are added to the solution of step a) in $HS(S)C-Y-Z$ or $HSe(Se)C-Y-Z$ acid form or in $M^{(+)}S(S)C-Y-Z^{(-)}$ or $M^{(+)}Se(Se)C-Y-Z^{(-)}$ salt form where $M^{(+)}=Li^{(+)}$, $Na^{(+)}$, $K^{(+)}$, $Rb^{(+)}$, $Cs^{(+)}$, $NH_4^{(+)}$, $PH_4^{(+)}$.

In general, the contact time in step c) is from 1 to 5 hours.

In general, the solvent is chosen from among chloroform, dichloromethane, toluene, heptane, another apolar or low polarity solvent, or mixtures thereof.

In a second embodiment, the method for preparing nanocrystals as described above comprises the following successive steps:

a) One prepares a solution in a first solvent of nanocrystals having an inorganic core consisting of at least one metal and/or at least one semi-conductor compound comprising at least one metal and that may optionally comprise one or several shell(s) surrounding said core, said shell(s) (each) consisting of a layer of a metal and/or at least one semi-conductor compound comprising at least one metal, the external surface of said nanocrystal being provided with an organic coating layer consisting of at least one first ligand compound different to the ligand compound of formula (I);

b) One adds to the solution of step a) a solution of ligand compounds of formula (I) in a second solvent, said ligand compounds of formula (I) not being soluble in said first solvent, from which one obtains a biphasic mixture comprising a first phase consisting of the solution of nanocrystals in the first solvent and a second phase consisting of the solution of ligand compounds of formula (I) in the second solvent;

c) One leaves said first and second phases in contact, preferably under agitation, for sufficient time so that the nanocrystals are essentially completely transferred into said second phase and that, at the surface of the nanocrystals, an essentially total exchange takes place of the first ligand compounds by the ligand compounds of formula (I).

In general, in step b), the compounds of formula (I) are added to the solution of step a) in HS(S)C—Y-Z or HSe(Se)C—Y-Z acid form or in $M^{(+)}$S(S)C—Y-$Z^{(-)}$ or $M^{(+)}$Se(Se)C—Y-$Z^{(-)}$ salt form where $M^{(+)}$=$Li^{(+)}$, $Na^{(+)}$, $K^{(+)}$, $Rb^{(+)}$, $Cs^{(+)}$, $NH_4^{(+)}$, $PH_4^{(+)}$.

In general, the contact time in step c) is from 1 to 5 hours.

In general, the first solvent is chosen from among apolar solvents and low polarity solvents such as chloroform, dichloromethane, toluene, heptane, hexane and mixtures thereof.

In general, the second solvent is chosen from among polar solvents such as alcohols, such as methanol and ethanol, water and mixtures thereof.

The method of the invention both in its first embodiment and in its second embodiment has a limited number of simple steps, easy to implement, and allowing great flexibility in the choice of ligand(s) with which one wishes to be able to cover the nanocrystals.

The reagents used are also easily available and can easily be prepared by known reactions; thus a Grignard synthesis allows the preparation of ligands of the HS(S)C—R-Z dithio carboxylic acid type in a simple manner and with good yields (see Examples 3 and 4 below).

Most of the other types of ligands such as, for example, xanthanes, dithio carbamates, etc. may be prepared form alcohols, amines, phosphines, etc., which react with carbon disulphide ($CS_2$) in the presence of a base.

Both in its first embodiment and in its second embodiment, the method according to the invention may comprise at the end of step c) and in the case where the nanocrystals are fluorescent, photoluminescent, an additional step during which the nanocrystals provided with an organic coating layer consisting of ligands (I) (said nanocrystals having been, if necessary, precipitated, separated, washed then dried) are subjected to an irradiation by a light, preferably an ultraviolet (UV) light.

In other words, the nanocrystals are subjected to an exposure to light, preferably ultraviolet light, for a given period, generally from one or several minutes to one or several hours, for example from one minute to 10 hours.

Said irradiation and exposure leads to a photochemical process that improves the fluorescence, photoluminescence efficiency.

Figure 1C:
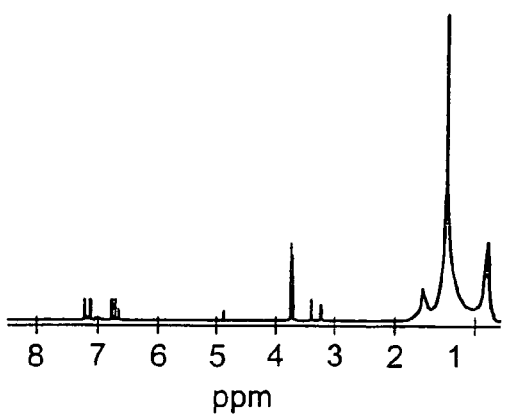
Figure 1D:
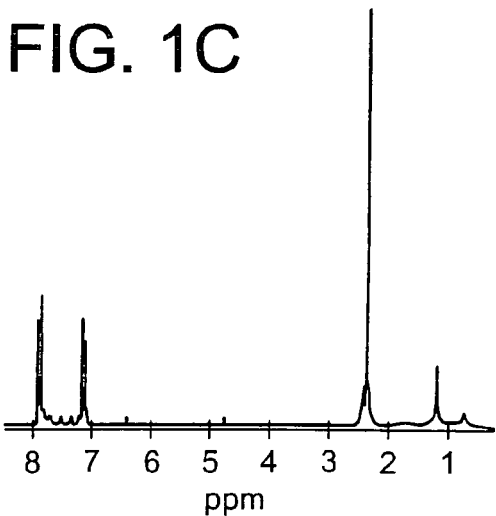
Figure 1E:
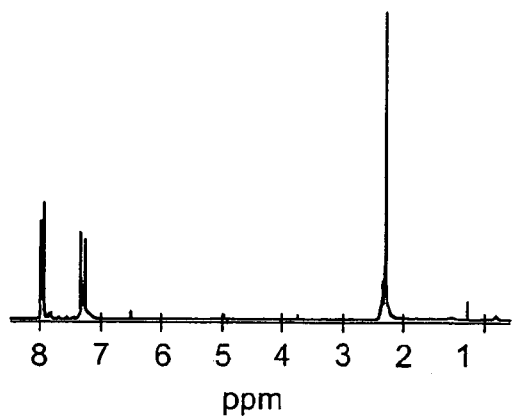
Figure 1F:
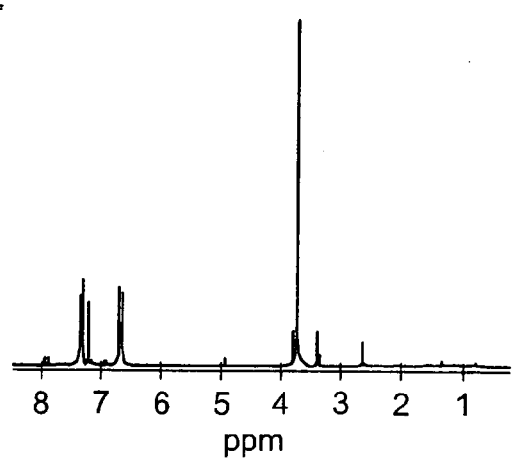

The invention will become clearer on reading the detailed description that follows, given by way of illustration and in nowise limitative, this description being made in referring to the appended drawings, in which:

FIGS. 1A to 1F represent the $^1$H NMR (200 MHz, $CDCl_3$) spectra of 4-methoxythiophenol (FIG. 1A), 4-dithiotoluic acid (FIG. 1B) and CdSe/ZnSe core/shell nanocrystals (with a diameter of around 6 nm) after the exchange reactions of the following ligands:

a) 1.5 ml of a solution of nanocrystals (3 mg/ml)+20 mg of 4-methoxythiophenol (reaction time: 72 h) (FIG. 1C).

b) 1.5 ml of a solution of nanocrystals (3 mg/ml)+20 mg of 4-dithiotoluic acid (reaction time: 1.5 h) (FIG. 1D).

solution a)+20 mg of 4-dithiotoluic acid (reaction time: 1 h) (FIG. 1E).

solution b)+20 mg of 4-methoxythiophenol (reaction time: 72 h) (FIG. 1F).

In all cases, the exchange is carried out at a temperature of 30° C. and the nanocrystals are purified/dried as described in example 5 below and then redispersed in 1.5 ml of $CDCl_3$.

Figure 2A:
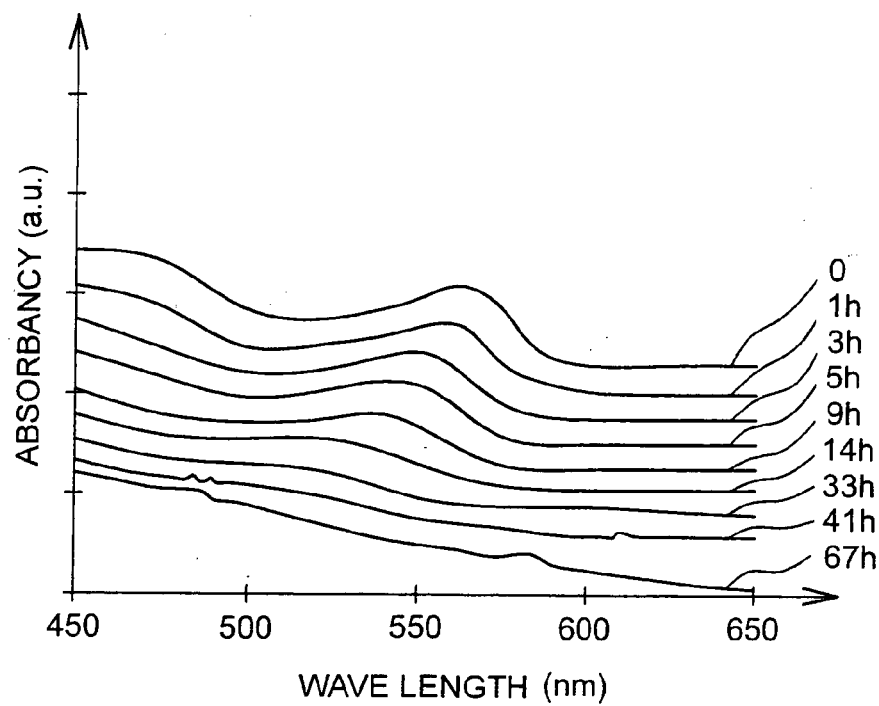
Figure 2B:
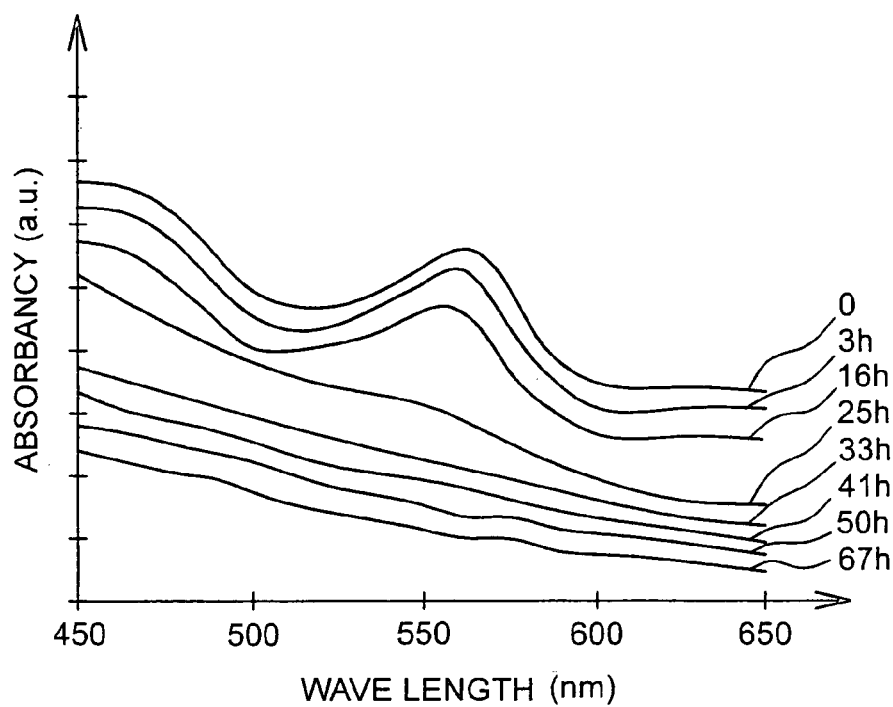
Figure 2C:
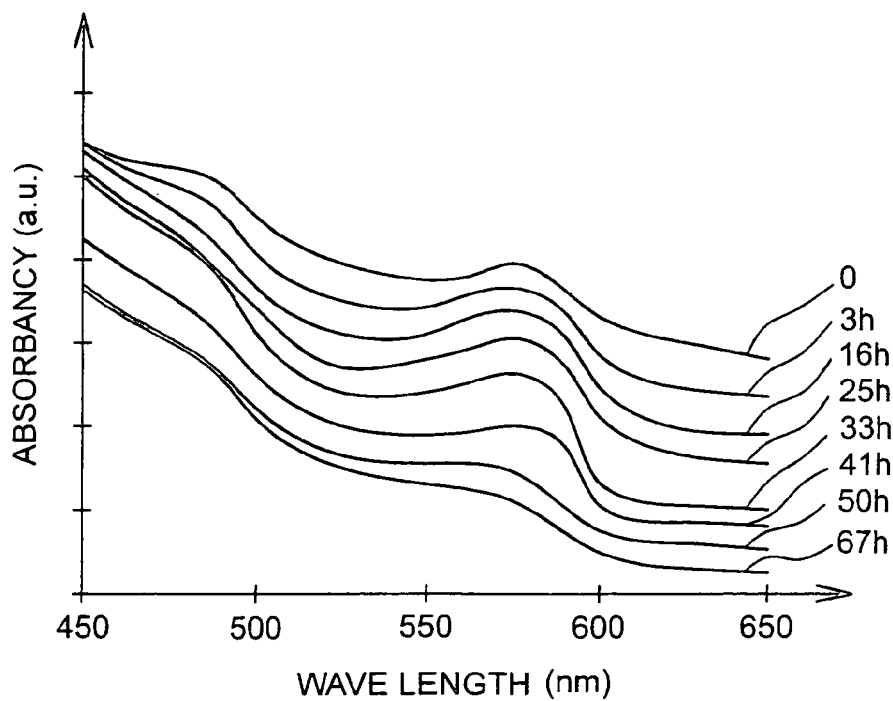

FIGS. 2A to 2C are graphs showing the evolution of the absorption spectra of colloidal solutions of CdSe nanocrystals of diameter of around 4.5 nm, during a continuous irradiation at 365 nm. The Y axis represents the absorbancy (in arbitrary units a.u.) and the X axis represents the wavelength (in nm).

The surface of the nanocrystals is covered by different ligands:

a) trioctyl phosphine oxide (TOPO)/trioctyl phosphine (TOP) (from the synthesis) (FIG. 2A);

b) after exchange with 1-dodecanethiol (FIG. 2B);

c) after exchange with 1-dithiotridecanoic acid (FIG. 2C).

Figure 3:
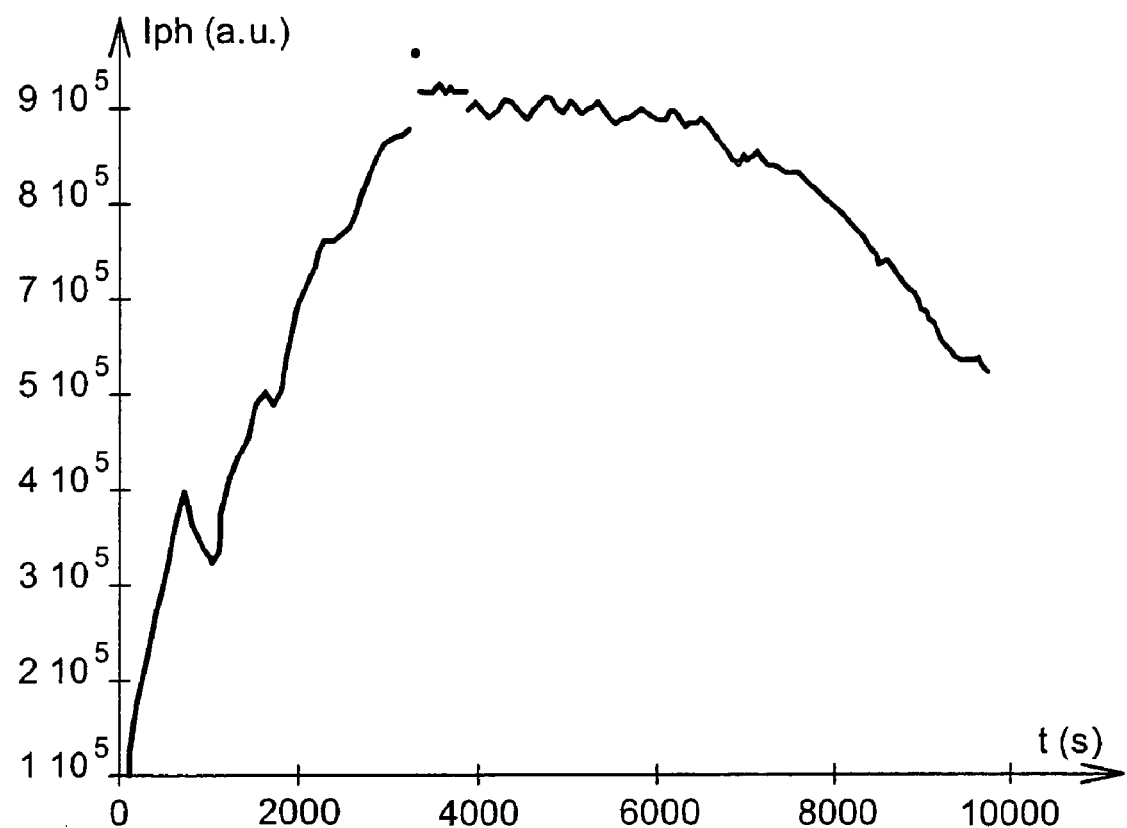

FIG. 3 is a graph representing the evolution of the photoluminescence intensity of a sample of CdSe/ZnSe core/shell nanocrystals (according to the invention and prepared in accordance with example 5), dispersed in chloroform, as a function of the exposure time to a UV irradiation from a mercury vapour lamp (365 nm, 100 W) (example 9).

The Y axis represents the photoluminescence intensity $I_{ph}$ (in arbitrary units a.u.) and the X axis represent the time (t) (in seconds).

DETAILED DESCRIPTION OF SPECIFIC EMBODIMENTS

The materials according to the invention are defined as being inorganic nanocrystals with an organic coating layer.

The inorganic nanocrystals generally consist of at least one metal and/or at least one semi-conductor compound.

The nanocrystals consist, for example, of at least one metal.

The metal may be any metal, but it is generally chosen from among transition metals, rare earth metals, metals of groups IIIA, IVA and VA of the periodic table of elements, and alloys thereof, and mixtures of said metals and alloys.

Preferably, the metal is chosen from among aluminium, copper, silver, gold, indium, iron, platinum, nickel, molybdenum, titanium, tungsten, antimony, palladium, zinc, tin, alloys thereof, and mixtures of said metals and alloys.

Preferably, the metal is gold.

The nanocrystals may consist of at least one semi-conductor compound. The semi-conductor compound may be a semi-conductor of formula AB in which A represents a metal or a non metal in oxidation state +II and B represents an element in oxidation state −II.

A is generally chosen from among Mg, Ca, Sr, Ba, Zn, Cd, Hg, Sn, Pb and mixtures thereof, and B is generally chosen from among O, S, Se, Te and mixtures thereof.

Examples of these compounds A (II) B (VI) are MgS, MgSe, MgTe, CaS, CaSe, CaTe, SrS, SrSe, SrTe, BaS, BaSe, BaTe, ZnO, ZnS, ZnSe, ZnTe, CdS, CdSe, CdTe, HgS, HgSe, HgTe, SnS, SnSe, SnTe, PbS, PbSe, PbTe and mixtures thereof.

The semi-conductor compound may also be a semi-conductor of formula CD (C (III) D (V)), in which C represents a metal or a non metal in oxidation state +III and D represents an element in oxidation state –III.

C is generally chosen from among Ga, In and mixtures thereof and D is chosen from among Sb, As, P, N and mixtures thereof.

Examples of these semi-conductor compounds of formula C (III) D (V) are GaAs, GaSb, GaN, InGaAs, InN, InGaN, InP, InAs, InSb and mixtures thereof.

It is also possible to use group IV semi-conductors such as silicon or germanium.

One may even use a mixture of AB, CD compounds and group IV semi-conductors.

In one embodiment of the invention, the inorganic nanocrystal has a core/shell structure, said core consisting of a nanocrystal as described above consisting of at least one metal and/or at least one semi-conductor compound whereas the shell(s) (each) consist(s) of a layer of a metal and/or at least one semi-conductor compound comprising at least one metal.

The core has, for example, a diameter of 15 to 150 Å whereas the shell(s) has (have) a thickness of 3 to 30 Å.

When the nanocrystal does not comprise shell(s), it generally has a diameter of core as a diameter of 15 to 150 Å.

The organic coating layer generally has a thickness of 5 to 100 Å.

All combinations are possible for the materials forming the core on the one hand and the shell(s) on the other hand but, preferably, the core is in a first semi-conductor compound whereas the shell surrounding said core (case of a single shell) or the first shell containing the core in the case where the core is surrounded by several shells, is in a second semi-conductor compound different to the first semi-conductor compound (forming the core).

The first and second semi-conductor compounds are chosen from the semi-conductor compounds described above.

Preferably, the core is in a semi-conductor compound of type A (II) B (IV) described above, such as CdSe, whereas the shell surrounding the core or the first shell surrounding the core is in a second semi-conductor compound of type A (II) B (VI) different to the first semi-conductor compound, chosen for example from among ZnSe, ZnS or CdS.

In the case of multiple shells, two successive shells are generally in different semi-conductor compounds.

Thus, in the case of multiple shells, the materials forming the shells may be chosen from among all of the possible combinations cited above, for example said compounds may be chosen from among SnSe, CdS and ZnS. For example, one could have a first shell in ZnSe or in CdS and a second shell in ZnS.

According to the invention, the external inorganic nanocrystal layer is covered with an organic coating later consisting of specific ligands conforming to the general formula (I):

In a fundamental manner, according to the invention, as already mentioned above, the X group, which may also be called an anchoring group, is a 1,1-dithiolate group (—C(S)S⁻) or a 1,1-diselenoate group (—C(Se)Se⁻).

The main advantageous properties of the nanocrystals of the invention are due to this specific X group.

The Y group or spacer group may be chosen from among a wide variety of groups, which may allow a charge transfer or even be insulating.

Y generally corresponds to the following formula:

where $R_1$ represents:
 a single bond;
 a group

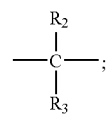

where $R_2$ and $R_3$ represent independently a hydrogen, an alkyl radical, an aryl radical, an alkoxy radical, a halogen;

A

group, where R' represents a hydrogen, an alkyl radical, an aryl radical, an alkoxy radical, a halogen;

A

group, where R' has the signification given above;

A

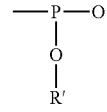

group, where R' has the signification given above;
 —O—;
 —S—;
 —Se—;

and R represents a linear or branched alkylene group having from 1 to 30 carbon atoms, preferably from 1 to 8; one or several carbon atoms of said alkylene group may optionally be replaced by one or several heteroatoms chosen from among O, N, S, P and Si; said alkylene group may optionally further comprise one or several double and/or triple bonds such as double and/or triple carbon-carbon bonds; and said alkylene group may be optionally further substituted by one or several groups chosen from among the halogens, such as chlorine, bromine, iodine and fluorine, heterocyclic compounds, aryl, hydroxyl, alkoxy, amino, acyl, carboxamido radicals; =O; —CHO; —CO$_2$H; —SO$_3$H; —PO$_3$H$_2$; —PO$_4$H$_2$; —NHSO$_3$H, sulphonamide, monoalkylamino trialkyl ammonium or even a dialkylamino radical, in which the two alkyl groups can form, jointly with the nitrogen atom of said dialkyl (C$_1$-C$_4$) amino group, to which they are bonded, a cyclic ring that may be optionally interrupted by one or several atoms of nitrogen, oxygen or sulphur, and the Z groups; or R represents a heterocyclic compound, an aryl radical, an aryl radical condensed on one or several other aryl rings and or alkyl and/or heterocylic rings, a cycloalkyl radical, a cycloalkyl-alkyl radical, an alkyl-cycloalkyl radical, an arylalkyl radical, an alkylaryl radical, a heterocycloalkyl radical or a alkyl-heterocycloalkyl radical.

According to the invention, the term alkyl for the alkyl radicals and for groups containing an alkyl part, signifies, unless otherwise stated, a linear or branched carbon chain having from 1 to 30 carbon atoms, preferably from 1 to 8, that may optionally be borne and/or interrupted by one or several oxygen, sulphur, nitrogen, phosphorous or silicon atoms and that may optionally in addition be substituted by one or several groups chosen from among halogen atoms, such as chlorine, bromine, iodine and fluorine, heterocyclic compounds; aryl, hydroxyl, alkoxy, amino, acyl, carboxamido radicals; =O; —CHO; —CO$_2$H; —SO$_3$H; —PO$_3$H$_2$; —PO$_4$H$_2$; —NHSO$_3$H, sulphonamide, monoalkylamino trialkyl ammonium; or even a dialkylamino radical, in which the two alkyl groups can form, jointly with the nitrogen atom of said dialkyl (C$_1$-C$_4$) amino group, to which they are bonded, a cyclic ring that may be optionally interrupted by one or several atoms of nitrogen, oxygen or sulphur.

According to the invention, the term alkoxy used for the alkoxy radicals and for groups containing an alkoxy part, signifies, unless otherwise stated, an O-alkyl chain, the term alkyl having the signification given above. The alkoxy radicals of the alkoxy carbonyl groups have, preferably, from 1 to 4 carbon atoms. The acyl groups have, preferably, from 2 to 4 carbon atoms.

According to the invention, heterocyclic is taken to mean an aromatic or non aromatic ring containing 5, 6 or 7 summits, and from 1 to 3 heteroatoms chosen from among nitrogen, sulphur and oxygen atoms. These heterocyclics may be condensed on other heterocylic compounds, or on other rings, particularly aromatic rings such as a phenyl group. Said heterocyclics may, in addition, be quarternised by an alkyl radical. The terms alkyl and alkoxy have the significations given above.

Among the heterocyclics, one may cite in particular by way of example the rings: thiophene, benzothiophene, furan, benzofuran, indole, indoline, carbazole, pyridine, dehydroquinoleine, chromone, thiazole, isothiazole, imidazole, pyrazole, triazine, thiazine, pyrazine, pyridazine, pyrimidine, pyridine, diazepine, oxazepine, benzotriazole, benzoxazole, benzimidazole, benzothiazole, morpholine, piperidine, piperazine, azetidine, pyrrolidine, aziridine.

According to the invention, cycloalkyl is taken to mean a radical having from 3 to 10, preferably from 4 to 8 C, and may optionally be substituted by one or several groups as defined above. Examples of cycloalkyl radicals are cyclobutyl, cyclopentyl and cyclohexyl.

According to the invention, aryl is taken to mean, unless otherwise stated, an aryl radical in C$_6$ to C$_{30}$ that may be optionally substituted by one or several alkyl radicals from 1 to 18 C; alkoxy; acyl; cyano; carboxamido; =O; —CHO; —CO$_2$H; —SO$_3$H; —PO$_3$H$_2$; —PO$_4$H$_2$; hydroxyl; amino; monoalkyl (C$_1$-C$_4$) amino; or dialkyl (C$_1$-C$_4$) amino; in which the two alkyl groups may form, jointly with the nitrogen atom of said dialkyl (C$_1$-C$_4$) amino group, to which they are bonded, a ring that may optionally be interrupted by one or several nitrogen, oxygen or sulphur atoms. Preferably, the aryl group is a phenyl group or a naphthyl group that may be optionally substituted as shown above.

In addition, R$_1$, R$_2$ and R$_3$ may bear one or several other Z groups.

The preferred Y groups are alkylene chains —(CH$_2$)$_n$—, where n=1 to 18, preferably n=12, aromatic rings that may be optionally substituted, such as

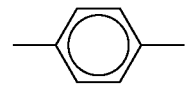

and alkoxy chains —[(CH$_2$)$_m$O(CH$_2$)$_m$]$_n$— where m=1 to 4 and n=1 to 6.

Depending on its chemical structure, the Y group or spacer group may influence the electronic properties of the ligand X—Y-Z as well as the stability and the solubility of the nanocrystal covered by said ligands.

For example, a Y group consisting of an aromatic ring —C$_6$H$_4$— may allow an electronic transfer through the ligand X—Y-Z, whereas a Y group consisting of a long alkyl chain such as —C$_{12}$H$_{14}$ may prevent this electronic transfer. A polyether type Y chain such as —(CH$_2$)s-O—(CH$_2$)$_2$—O—(CH$_2$)s—may increase the solubility of the nanocrystals in polar media compared to ligands where Y does not contain heteroatoms such as oxygen. Furthermore, depending on its chemical structure, the Y spacer may bear one or several identical or different Z functions.

The Z group may be any group, but it is generally chosen in order to obtain specific properties, such as for example a solubility of the nanocrystals in a specific solvent defined by a given polarity.

The Z group may therefore be chosen from among groups that allow the solubilisation of the nanocrystals in apolar solvents and/or in low polarity solvents, such as hydrocarbons: or instead the Z group may be chosen from among groups that allow the solubilisation of the nanocrystals in polar solvents such as water, alcohols or mixtures thereof.

The Z group, apart from the fact of allowing the solubility of the nanocrystals in solvents with a given polarity, may further allow the nanocrystals to be linked to other molecules such as biological molecules, conjugated polymers or oligomers or others, and/or the Z group may even already contain conjugated polymers or oligomers or biological molecules.

In addition, the Z group may allow the link between the nanocrystals (in other words, the link between the nanocrystal and one or several other nanocrystals).

The Z group may thus be chosen from among groups that allow the nanocrystals to link with other molecules.

Advantageously, the Z group is chosen from among hydrophilic groups, particularly polar groups, such as hydroxyl groups, formyl groups, alkoxides, carboxylic acids, amines, polyethers, such as polyethyleneglycol, and charged groups such as carboxylate groups, sulphonates, phosphates, nitrates, ammonium salts and analogues.

Z may also be identical to X, thus allowing the link between nanocrystals.

Z may also be simply a hydrogen atom.

The preferred Z groups among all groups are as follows: hydroxyl (—OH) to allow a dispersion of the nanocrystals in polar solvents; formyl (—CHO) and carboxylic acid (—COOH) to allow the nanocrystals to link with other molecules.

Several identical or different Z groups may be present on the same ligand, which then has a formula of the type:

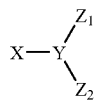

where $Z_1$ and $Z_2$, identical or different, have the signification already given for Z.

Furthermore, several X groups may be present on the same ligand, which then has a formula of the type:

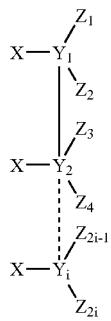

where $Y_1$, $Y_2$ and $Y_i$, identical or different, and $Z_1$, $Z_2$, $Z_3$, $Z_4$, $Z_{2i-1}$, $Z_{2i}$, identical or different, have the signification already given above for Z and Y.

Furthermore, several ligands that differ by the Y and/or Z group(s) that they contain may be present on the same nanocrystal, which makes it possible to confer to said nanocrystal all of the desired properties and to adapt, in a "made to measure" manner, these properties as a function of the dissolution medium and the desired application.

Thus, one may introduce on the nanocrystal both ligands that assure the solubility of the nanocrystals in a given solvent and ligands that have functions allowing the link with other molecules, or instead even the same ligands may bear functions that assure the solubility in a given solvent and functions that allow the link with other molecules.

Thanks to the method for preparing the nanocrystals, it is very easy to control and adjust the number of functions of one category compared to another by changing the ratio of the two ligands during the functionalisation of the nanocrystals.

The nanocrystals according to the invention, provided with an organic coating layer consisting of the ligands (I) may be fluorescent, photoluminescent nanocrystals.

Those skilled in the art may easily chose the nature of the organic core, and/or the shell and/or the ligands (I) to ensure that the nanocrystal according to the invention is fluorescent, photoluminescent.

When the nanocrystals are fluorescent, luminescent, in other words when the desired application of the nanocrystals relies on their fluorescence, photoluminescence, they may be subjected to an irradiation by a light, preferably an ultraviolet light, which improves and enhances the fluorescence, photoluminescence efficiency and intensity, due to a photochemical process.

The method for preparing the nanocrystals according to the invention will now be described.

In a first step, one prepares an inorganic nanocrystal with a simple "core" structure or even a "core/shell" structure to the surface of which is then fixed the coating layer of organic ligands according to the invention.

Any known method may be used to synthesise the nanocrystals.

However a preferred process is that described in the document FR-A-2 838 241 already mentioned above and which allows the preparation of semi-conductor nanocrystals of formula AB where A is a metal or a non metal in oxidation state +II and B represents a chemical elements in oxidation state −II.

In this method, in order to synthesise the AB semiconductor nanocrystals, one begins by reacting an oxide of A with a powder of B.

One chooses, as a specific reagent, an oxide of A such as CdO, or HgO, because this type of oxide reagent, for example CdO, is less reactive and easier to use than dialkyl metal compounds, for example, such as the dialkyl cadmium compounds widely used in other methods.

It is normally necessary to complex the oxide of A, such as CdO, with an alkyl phosphonic acid.

Various high boiling point alkyl phosphonic acids may, in principle, be used as complexing agents; such acids correspond, for example, to the following formula:

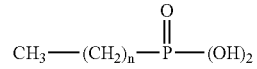

where n is a whole number from 5 to 15.

The preferred complexing agent is dodecyl phosphonic acid (DDPA).

The powder of B is the second specific reagent of this method. It may be, preferably, a powder of Se, of Te, or of S, Se being preferred. This reagent is normally dissolved in trialkyl phosphine, in which the alkyl group has from 4 to 12 carbon atoms, the preferred trialkyl phosphine being trioctyl phosphine. The concentration of the powder of B in the trialkyl phosphine is normally from 0.1 M to 0.5 M.

The reaction takes place according to this method in a specific solvent consisting of a mixture of at least one trialkyl phosphine oxide and at least one primary alkyl amine.

The primary alkyl amine is generally chosen from among long chain primary amines, in other words comprising from 6 to 24, preferably 14 to 24, carbon atoms, and with a high boiling point; the amine again preferred is hexadecyl amine (HDA).

The trialkyl phosphine oxide is generally chosen from among trialkyl phosphine oxides in which the alkyl group comprises from 4 to 12 carbon atoms, trioctyl phosphine oxide (TOPO) being preferred.

It has been observed that the relative molar concentration of each of the compounds entering the solvent mixture influences the growth kinetics and size distribution of the nanocrystals, and therefore the mixture generally comprises 50 to 90% in moles of alkyl amine, for example HDA.

The preferred molar concentration is from 60 to 80% in moles of alkyl amine, for example HDA.

During a typical implementation of this method, the solvent mixture, for example TOPO/HDA and the oxide, for example CdO, are heated in a flask above the melting temperature of the solvents, this temperature is therefore generally above 60° C., preferably from 150 to 250° C.

The complexing agent, such as DDPA, is then added, then the temperature is raised to around 260-300° C. During this heating, the powder of oxide, such as CdO, dissolves and a colourless and transparent solution, in the case of CdO, is formed.

The temperature of the complexation reaction depends to a large extent on the relative quantities of the two compounds forming the solvent, for example HDA and TOPO, and decreases when the relative concentration in trialkyl phosphine oxide, for example in TOPO, increases.

The solution of B, for example Se, in the trialkyl phosphine, for example TOP, is prepared separately at ambient temperature, then very rapidly injected into the flask. The temperature of the reactive mixture in the flask during the injection is of crucial importance. It must, preferably, be between 240 and 300° C.

It should be pointed out here that the temperature of the reactive medium influences to a very large extent the nucleation and growth of the nanocrystals. In general, for similar reaction times, smaller nanocrystals are formed at low temperatures. For a given temperature, the final size of the nanocrystals is determined by the reaction time.

The reaction time is, for example, from 2 to 90 minutes.

The reaction may be stopped at any time, by cooling the reaction mixture in order to obtain a sample of nanocrystal of desired size. The nanocrystals are then precipitated by adding an appropriatte mixture, for example of methanol and n-butanol, then separated, for example, by centrifugation and purified.

It should be added that the method described above assures a better quality of core nanocrystals than other methods.

This is due to a very narrow size distribution, which is an important advantage of this method. In the methods of the prior art, a step—expensive in material—of sorting the nanocrystals into fractions of given size must be used to obtain samples in which the size distribution width is as narrow as that procured directly by the method of the invention, namely less than 5%.

The method described in the document FR-A-2 838 241 has the advantage of not comprising a step of sorting the nanocrystals into given size fractions (fractionation) and is considerably simpler than other methods.

At the end of the preparation of the semi-conductor nanocrystals, one may carry out on said nanocrystals the synthesis and growth of a shell that is, for example, in ZnSe.

The core/shell pair (CdSe/ZnSe) constitutes, according to this document, one of the best choices, or even the best choice possible for the A (II) B (VI) compounds.

Two types of zinc precursors may be chosen for the preparation of a shell in ZnSe: zinc oxide (ZnO) and a zinc carboxylate of general formula:

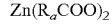

Where $R_a$ represents an aliphatic alkyl group with 1 to 24 carbon atoms, the preferred zinc carboxylate is the zinc stearate of formula:

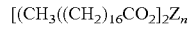

The advantage linked to their use stems, in particular, from the fact that they are industrially produced compounds, inexpensive, and a lot easier to handle than dialkyl zinc compounds.

In the case of ZnO, the complexation by an alkyl phosphonic acid, already described above, is required, as for the preparation of the core from, for example, CdO.

ZnO is complexed, for example, by dodecyl phosphonic acid (DDPA) in trialkyl phosphine oxide, for example TOPO between 350 and 360° C.

The resulting colourless solution is diluted to a concentration of 0.1 M to 0.5 M, for example at around 60° C. in a small amount of toluene or any other solvent, for example, allowing the improvement of its rheological properties.

The use of a zinc carboxylate, such as zinc stearate, is even more simple, since the product is simple diluted in an appropriate solvent, such as toluene, with a complexation step.

The source of selenium is the same as for the preparation of the core: selenium powder dissolved in a trialkyl phosphine, preferably in TOP. This solution is mixed at ambient temperature with the solution containing the source of zinc (oxide or carboxylate). Moreover, the resulting mixture may easily be injected by means of a syringe into the flask where the synthesis is carried out.

For the growth of the shell, the injection takes place in a solvent consisting of a mixture of at least one trialkyl phosphine oxide and at least one primary alkyl amine, the preferred mixture consisting of a mixture of TOPO and HDA. The mixture of solvents, for example TOPO/HDA, contains a dispersion of core nanocrystals, for example in CdSe.

The temperature of this mixture is of primary importance. If too low, no crystalline growth reaction of ZnSe occurs. On the other hand, if said temperature is too high, crystalline nuclei of ZnSe form and nanocrystals of ZnSe appear instead of the epitaxial growth of ZnSe on the cores, for example in CdSe. Moreover, a too high temperature may lead to a widening of the size distribution of the nanocrystals, for example in CdSe, due to an exchange of materials between the nanocrystals through dissolution followed by redeposition. In this context, the use of a trialkyl phosphine oxide/primary alkyl amine solvent mixture, for example TOPO/HDA, with a high level of HDA, namely 50 to 80% in moles, plays a crucial role. The HDA is less strongly linked to the Zn than the TOPO, thus allowing the formation of the shell at lower temperatures. Moreover, thanks to the lower steric hindrance, the HDA assures better chemical passivation of the surface than TOPO (or TOPSe), in particular for the largest sizes of core/shell systems, with the lowest curved surface.

However, an alkyl amine, such as pure HDA, is not a solvent suitable for the growth of the shell.

The best results are therefore obtained with a solvent mixture consisting of, preferably, from 60 to 80% alkyl amine, preferably HDA, i.e. 40 to 20% of trialkyl phosphine oxide (TOPO), in molar fractions.

The presence of the HDA on the surface of the shell may be determined quantitatively by measuring the $^1$H NMR (200 MHz, CDCl$_3$) spectra of the nanocrystals, for example, CdSe/ZnSe prepared by the method of the invention, thanks to the peak due to the $\alpha$-CH$_2$ protons in the alkyl chain of the HDA.

Finally, the choice of temperature depends on the size of the core nanocrystals, for example in CdSe, used for the synthesis. In the immense majority of cases, the temperature is in the range 170-210° C., the highest values being used for the largest core nanocrystals. Since the formation of the ZnSe nuclei is facilitated by a high concentration of zinc and selenium precursors, the injection of their solution should, preferably, be extremely slow, with a constant speed, for example from 3 to 10 ml per hour for a total volume of 5 ml to be injected.

One preferably uses, for this purpose, a commercial automated syringe driver type of microinjection system.

When the addition of the ZnSe precursors is completed, the reaction medium is maintained at the synthesis temperature for a given time, for example from one to two hours, to allow the "annealing" of the shells and to improve their crystalline quality. This mixture is then chilled, for example, to 60° C.

The steps of precipitation by a mixture, for example of methanol/n-butanol, separation and purification are then carried out in exactly the same way as for the preparation of the core nanocrystals.

The mid-height width of the emission band for the core nanocrystals, for example in CdSe, as for the core/shell, for example CdSe/ZnSe, is extremely narrow, typically 25 to 30 nm, as synthesised, without any size sorting procedure.

The fluorescence quantum efficiency at ambient temperature of the A (II) B (IV) semi-conductor core/shell nanocrystals thus prepared is very high. It exceeds 60% or even, in certain cases, 80%.

On completion of this method, one obtains nanocrystals comprising a core that may be surrounded by a shell, said core consisting of a semi-conductor nanocrystal of formula AB in which A represents a metal or a non metal in oxidation state +II (Cd, Hg) and B represents a chemical element, such as a metal or non metal, in oxidation state –II (Se, S, Te) and the shell consists, for example, of a layer of ZnSe, the surface of the nanocrystals being provided with an organic passivation layer consisting of at least one primary amine such as hexadecyl amine (HDA) associated with at least one phosphine oxide compound such as trioctyl phosphine oxide (TOPO) and/or phosphine selenide such as trioctyl phosphine selenide (TOPSe).

The inorganic nanocrystal obtained at the end of the first step generally comprises, due to the very method of preparation used to prepare it, an organic coating layer consisting of ligands that are different to the specific ligands of formula (I) according to the invention.

The ligands are generally chosen from among phosphine oxides such as trialkyl phosphine oxide, in which the alkyl group comprises from 4 to 12 carbon atoms, such as trioctyl phosphine oxide (TOPO), phosphine selenides such as trialkyl phosphine selenides, in which the alkyl group comprises from 4 to 12 carbon atoms, such as trioctyl phosphine selenide (TOPSe); trialkyl phosphines such as trialkyl phosphines in which the alkyl group comprises from 4 to 12 carbon atoms such as trioctyl phosphine (TOP); primary amines such as alkyl amines in which the alkyl group comprises from 6 to 24 carbon atoms such as hexadecyl amine (HDA); and carboxylic acids such as stearic acid; and mixtures thereof.

In a second step, in order to prepare the nanocrystal according to the invention, one places in solution the nanocrystals prepared above and which have on their external surface a coating layer consisting of one or several ligands different to the ligands of formula (I) specific to the nanocrystals according to the invention, in a solvent.

In a first embodiment of the second step, the ligands (I) in the acid HS(S)C—Y-Z or HSe(Se)C—Y-Z form, according to the invention, are soluble in the same solvent as that used to prepare the solution of nanocrystals described above (solution of nanocrystals known as "before the exchange"), for example chloroform, dichloromethane, toluene, heptane, another apolar solvent or a low polarity solvent, or mixtures thereof.

It should be noted that throughout the description, we have used the term "ligand" to designate indiscriminately the organic molecule fixed to the external surface of the nanocrystal, which is a dithiolate or a diselenoate, and the corresponding organic molecule in solution that is then found in the dithio carboxylic acid or diseleno carboxylic acid form.

The exchange of molecules at the surface of the nanocrystals by these new dithiolate or diselenoate ligands according to the invention of formula (I) is simply carried out by adding the new ligands of formula (I) to the solution of nanocrystals from the first step, in such a way as to obtain in the solution an excess (namely a molar ratio of from 5:1 to 15:1, for example) of these new ligands (I) compared to the ligands present on the nanocrystals.

One obtains a complete and total exchange of the ligands initially present by the ligands (I) in a time generally of from 1 to 5 hours under agitation at ambient temperature (25-30° C.).

Generally, one then precipitates the nanocrystals provided with an organic coating layer consisting of the ligands (I) by adding to the solution of nanocrystals a solvent or a mixture of solvents with a different polarity. These solvents are generally chosen from among methanol, ethanol, propanol, butanol or other polar solvents.

If desired, optionally, the nanocrystals may then generally be separated, for example by filtration, then they are generally washed, rinsed from 1 to 4 times with the same solvent that was used in the precipitation. The nanocrystals are then generally dried, for example for a time from 1 to 5 hours, preferably under vacuum, at a temperature from 20 to 60° C.

A second embodiment of the second step is used in particular in cases where the new ligands are not soluble in solvents that are too polar to disperse the nanocrystals such as alcohols such as methanol, ethanol, etc. or water or mixtures thereof.

This is particularly the case in using ligands (I) in the form of salts of formula $M^{(+)}S(S)C$—Y-$Z^{(-)}$ or $M^{(+)}Se(Se)C$—Y-$Z^{(-)}$ where $M^{(+)}$ is generally chosen from among $Li^{(+)}$, $Na^{(+)}$, $K^{(+)}$, $Rb^{(+)}$, $Cs^{(+)}$, $NH_4^{(+)}$ and $PH_4^{(+)}$.

One then carries out a heterogeneous biphasic exchange in which the phase of nanocrystals (with the "old" ligands) in a solvent, preferably apolar, such as chloroform and the phase of the new ligand (I) (in a polar solvent such as methanol or water) are brought into intimate contact, preferably under vigorous agitation, up to the complete transfer of the nanocrystals into the polar phase.

Generally, one may precipitate, one may separate, one may wash and one may dry the nanocrystals covered in ligands (I) in the same way as in the first embodiment. But the solvent used for the precipitation and rinsing and washing is, in this case, an apolar solvent chosen for example from among heptane, hexane or toluene solvents.

At the end of step c), in both the first embodiment and in the second embodiment, the nanocrystals provided with an organic coating layer consisting of ligands (I), which may be precipitated, separated, washed then dried, are subjected to an irradiation by a light, preferably an ultraviolet light, for example an UV light with a wavelength of 365 nm.

This irradiation is carried out in the case where the nanocrystals provided with an organic coating layer consisting of the ligands (I) are fluorescent, photoluminescent nanocrystals.

In other words, in the case where one uses fluorescent, photoluminescent nanocrystals, said nanocrystals may be, following step c) and, if desired, after the precipitation, separation, washing (rinsing) and drying steps, subjected to a photochemical treatment in order to increase and improve the efficiency and the intensity of the fluorescence, photoluminescence. Said irradiation is preferably carried out by dispersing the nanocrystals provided with an organic coating layer consisting of the ligands (I) in an appropriate solvent, and by exposing the nanocrystals to an irradiation of light, preferably to ultraviolet light.

Said solvent used for the dispersion may be chosen from among apolar solvents and solvents of low polarity such as chloroform, dichloromethane, toluene, heptane, hexane, and mixtures thereof: or among polar solvents such as alcohols, water and mixtures thereof.

The irradiation time necessary to obtain a maximum fluorescence of the sample may extend from one or several minutes to one or several hours, for example 10 hours and, in particular, 1 hour.

This irradiation time may vary depending on the experimental conditions such as the specifications of the light source, the distance between the source and the sample of nanocrystals, the concentration of the sample (when a dispersion of nanocrystals in a solvent is irradiated); said time may be determined by photoluminescence spectroscopy.

More precisely, the time, the duration of the irradiation, particularly by UV light, is generally from 1 minute to 10 hours, preferably from 10 minutes to 200 minutes, even more preferably from 50 to 100 minutes, for example 60 minutes.

By way of illustration, one places the sample of nanocrystals, preferably in suspension in a solvent such as chloroform, in a quartz bowl at a distance of 3 to 5 cm from a 100 W mercury lamp that emits at 365 nm; and one exposes the sample to an irradiation for one hour (cf. FIG. 3).

The invention will now be described in reference to the following examples, given by way of illustration and in nowise limitative.

EXAMPLES

All handling of air sensitive materials were carried out using a standard technical (or Schlenk type) vacuum manifold or a glove box under argon.

All of the products came from ALDRICH. Calcium oxide (purity 0.999), zinc oxide (purity 0.999), selenium powder (purity 0.99999), zinc stearate (purity 0.95), magnesium (purity 0.9998), 1-bromododecane (purity 0.97), 4-bromotoluene (purity 0.98), carbon disulphide (purity 0.999), 1-dodecanethiol (purity 0.985), 4-methoxythiophenol (purity 0.97) and toluene, THF, methanol and anhydrous n-butanol were used as found: the trioctyl phosphine (TOP, purity 0.9), trioctyl phosphine oxide (TOPO, purity 0.9) and hexadecyl amine (HDA, purity 0.9) were purified by distillation.

Since dodecyl phosphonic acid (DDPA) is not commercially available, it was synthesised by following the method published in Method. Org. Chem. 12/1, pages 352-353, 435 (1963). The product was identified by NMR spectroscopy of the $^1H$, $^{13}C$ and $^{31}P$ nuclei.

Optical characterisation: the UV-visible absorption spectra were measured on a HEWLETT-PACKARD® 8 452A spectrophotometer, the photoluminescence spectra were acquired with a CCD camera coupled to a JOBINYVON® HR 460 monochromator with a resolution of 0.1 nm, the excitation wavelength (365 nm) being emitted by a high-pass filter (cut at 400 nm).

For these spectroscopic measurements, the colloidal solutions of nanocrystals diluted in toluene were placed in quartz bowls of optical path 1 mm.

The NMR spectra were carried out under the following conditions: BRUKER® AC 200, 200 MHz.

Example 1

In this example, we describe the preparation of core CdSe nanocrystals covered with TOPO/TOP.

These crystals will then be used in the preparation of CdSe/ZnSe core/shell nanocrystals.

51.4 mg of CdO (0.4 mmol) were placed in a double necked flask under a constant flow of purified argon. Then, 0.15 ml of TOPO and 2.85 of HDA were added, forming the solvent mixture with a molar fraction of 80% of HDA. The vessel was then heated to 200° C., under magnetic agitation. At this point, 230 µl of DDPA (0.8 mmol) were added and the temperature increased to around 270° C. for one hour. The complexation reaction—namely the reaction of cadmium oxide with DDPA to give the calcium phosphate—takes place during this time and reveals itself through the formation of a colourless liquid. Then, the temperature was lowered to 250° C. and stabilised.

A solution of selenium of concentration 0.2 mol/l was then prepared separately, at ambient temperature, by dissolving 157.9 mg (2 mmol) of Se powder in 10 ml of TOP. 2.5 ml of this solution were then rapidly injected into the flask containing the Cd precursor solution, still under vigorous agitation. 100 µl quantities were regularly sampled from the reaction medium, in such a way as to monitor the nanocrystal growth process. The narrowest size distribution was obtained when the reaction was stopped in the interval between 3 and 30 minutes after the injection, the average diameter of the nanocrystals ranging from 3.2 nm (for 3 minutes reaction) to 4.6 nm (30 minutes). The reaction medium was cooled to around 60° C. when the desired size was reached. The core nanocrystals were then precipitated by adding a mixture of 10 ml of methanol and 1 ml of n-butanol. They were then separated from the excess liquid by centrifugation, washed in methanol and dried by a flow of argon. The nanocrystals may be returned to solution in various organic solvents such as toluene, chloroform, alkanes, ethers, etc. to carry out the measurements on their optical properties.

The absorption and photoluminescence spectra of the series of samples taken during the reaction described above allowed a certain number of conclusions to be drawn.

The absorption spectra showed, in addition to the excitonic peak, events characteristic of the highest energy excited states. The photoluminescence peak had a low mid-height width, namely between 25 and 29 nm, which indicates, without any dispute, that the size distribution of the prepared nanocrystals is very narrow. This is confirmed by the determination of the size distribution carried out by MET: the maximum deviation in relation to the mean is less than 5%, without having the need for any size sorting process.

The MET image, obtained with an acceleration voltage of 300 kV on a JEOL 3010 electron microscope, on CdSe nanocrystals sampled after 10 minutes during the above reaction show that their size distribution is sufficiently narrow, thanks to the method according to the invention, to allow their "crystallisation" on a super three-dimensional network.

Example 2

In this example, we describe the preparation of CdSe/ZnSe core/shell nanocrystals, covered by TOPO/TOP/HDA with zinc stearate as zinc source.

In a flask, a solution of zinc stearate (ZnSt$_2$) of concentration 0.2 mol/l was prepared by mixing 632.3 mg of zinc stearate (ZnSt$_2$) (1 mmol) with 5 ml of toluene and moderate heating.

2.5 ml of this dispersion, which remained cloudy, were mixed at ambient temperature with the same volume of a solution of Se in TOP of concentration 0.2 mol/l, prepared as in example 1. The whole of this mixture was placed in a syringe.

In the flask intended for the synthesis, around 20 mg of core nanocrystals of average diameter 3.6 nm and with a size dispersion of less than 5%, prepared as described in example 1, were dispersed in a solvent mixture consisting of 2.0 ml of TOPO and 2.0 ml of HDA (i.e. a molar ratio of around 2 to 3). This mixture was then heated to 190° C. As soon as the temperature was stabilised, the solution containing the ZnSt$_2$/Se mixture was slowly injected into the flask using a syringe driver at a rate of 5 ml/h, while the contents of the flask were vigorously agitated. The growth of the shell was monitored by regular sampling, as described in example 1. When the injection of the ZnSt$_2$/Se mixture was complete, the flask was left at 190° C. for 90 minutes, in order to "anneal" the nanocrystals, to eliminate stacking defects in the shell and at the core/shell interface. The synthesis was completed by cooling the flask to 60° C. The resulting nanocrystals were precipitated and purified using the method described in example 1. They were returned to solution in an organic solvent for the determination of their optical properties (cf. example 1).

Example 3

In this example, we describe the synthesis of dithiotridecanoic acid.

In a flask (three necked) under an inert blanket, were placed 5 equivalents of magnesium (0.1 mol/2.44 g) covered with 10 ml of anhydrous THF. 1 equivalent of bromododecane (0.02 mol/5.01 g) dissolved in 20 ml of anhydrous THF was then added drop by drop. Once complete, the mixture was heated to 60° C. for 2 hours. A grey suspension was obtained.

In a glove box, a flask (two necked) was prepared with 3 equivalents of carbon disulphide (0.06 mol/4.56 g) in 10 ml of THF and, outside the glove box, this mixture was cooled to −5° C. Under an inert blanket, the grey suspension prepared previously was added drop by drop. The resulting mixture turned yellow, then orange. The temperature was then raised to ambient temperature and left under agitation for 12 hours.

The reaction mixture was hydrolysed with 40 ml of a diethyl ether/water mixture (1:1). The organic phase became yellow-orange, the aqueous phase yellow. It was acidified with 15 ml of HCl (0.2M): the aqueous phase became colourless, since the product in the acid form passed into the organic phase. In order to optimise the yield, the aqueous phase was extracted several times with ether (pH≦7). The organic phases were added together and extracted with water (100 ml), dried over MgSO$_4$ and concentrated in a rotary evaporator. 3.46 g (70%) of a bright yellow, partially crystallised oil was recovered. The product was identified by NMR spectroscopy of the $^1$H and $^{13}$C nuclei and by elementary analysis.

Example 4

In this example, we describe the synthesis of 4-dithio toluic acid.

In a flask (three necked) under an inert blanket, were placed 5 equivalents of magnesium (0.05 mol/1.21 g) covered with 10 ml of anhydrous THF. 1 equivalent of 4-bromotoluene (0.01 mol/1.71 g) dissolved in 15 ml of anhydrous THF was then added drop by drop. After several drops, reflux began and the solution became cloudy. The mixture was then heated to 60° C. for 2 hours. The solution became dark brown.

In a glove box, a flask (two necked) was prepared With 3 equivalents of carbon disulphide (0.03 mol/2.34 g) in 10 ml of THF and, outside the glove box, this mixture was cooled to −5° C. Under an inert blanket, the brown suspension prepared previously was added drop by drop. After several drops, the solution became yellow, then dark red. The temperature was then raised to ambient temperature and left under agitation for 12 hours.

The reaction mixture was hydrolysed with 40 ml of a diethyl ether/water mixture (1:1). The organic phase became yellow-orange. In order to purify it, the aqueous phase was extracted with ether (150 ml) and the organic phases added together containing the secondary products were discarded. Then, the aqueous phase was acidified with 25 ml of HCl (0.2M) and extracted with ether: the organic phase became dark violet. The acidification and extraction were continued until the phase became colourless (25 ml 0.2 M HCl, 200 ml ether). The organic phases were added together and extracted with water (100 ml). After drying over MgSO$_4$, the organic phases were concentrated in a rotary evaporator. 720 mg (43%) of a violet, partially solidified oil was recovered. The product was identified by NMR spectroscopy of the $^1$H (see FIG. 1B) and $^{13}$C nuclei and by elementary analysis.

Example 5

In this example, we describe the preparation of nanocrystals according to the invention coated with dithiolate type ligands.

The nanocrystals of CdSe or CdSe/ZnSe, prepared as described in examples 1 and 2, were redispersed in anhydrous chloroform with a concentration of around 3 mg/ml. For the exchange of ligands, 20 mg of dithio carboxylic acid, either 1-dithiotridecanoic acid or 4-dithiotoluic acid, in a microtube containing 1.5 ml of the solution of nanocrystals with the "old" ligands. This was left under agitation for 2 hours at 30° C. to ensure a complete exchange of the old ligands by the new ligands according to the invention. The nanocrystals covered by dithiolate were then precipitated with 3 ml of methanol and washed several times with the same solvent in order to remove the excess of 1-dithiotridecanoic or 4-dithiotoluic acid, and the ligands desorbed from the surface. The nanocrystals were dried in a vacuum manifold and redispersed in chloroform or CDCl$_3$. The exchange may be characterised by standard analysis techniques such as NMR, UV-visible or IR.

Example 6

In this example we describe the preparation of nanocrystals coated by thiol type ligands.

The same method as that used for the preparation of the nanocrystals coated with dithiolate type ligands (see example 5) may be applied to carry out the exchange with thiol type ligands that are 4-methoxythiophenol (Z-Y—SH where Y=C$_6$H$_4$ and Z=OCH$_3$) and dodecanethiol (Z-Y—SH where Y=(CH$_2$)$_{12}$ and Z=H).

However, the reaction time must be increased (up to at least 72 hours) in order to obtain a virtually complete exchange.

Example 7

In this example, we compare the affinity of dodecanethiol and tridecane dithiolate ligands for the surface of the nanocrystals.

In order to study the stability of the nanocrystals with a thiol or dithiolate type ligand vis-à-vis the ligand bearing the other anchoring function, the nanocrystals prepared in examples 5 and 6 were redissolved in $CHCl_3$ and the complementary ligand was added in excess.

In this example, the 4-dithiotoluic acid prepared in example 4 was used because the aromatic protons enable a simple detection of the level of exchange in the $^1H$ NMR spectra (see NMR spectrum of 4-dithiotoluic acid in FIG. 1B), thanks to the high displacement of their chemical shift compared to the alkyl chain protons in TOPO, TOP and HDA.

The thiol chosen for the comparison was 4-methoxythiophenol since it allows a clear distinction from 4-dithiotoluic acid in the NMR spectra due to the methoxy function (see NMR spectrum of 4-methoxythiophenol in FIG. 1A). The purification was carried out in the same way as before.

The $^1H$ NMR spectra show that the thiol type ligand (namely the 4-methoxythiophenol) was completely replaced after 1 hour by the dithiolate type ligand (namely dithio toluic acid) (see FIGS. 1A to 1F). In the opposite case, even after 72 hours, around 5-10% of the dithiolate type ligand remained at the surface of the nanocrystals. This clearly shows that the bond formed during the exchange reaction is more stable in the case of the dithiolate type ligand compared to the thiol.

In a detailed manner, in FIGS. 1A to 1F, the greater affinity of the new dithiolate ligands for the surface of the nanocrystals compared to the thiol ligands of the prior art is demonstrated by NMR spectroscopy.

As described above, initially the ligands at the surface of the CdSe/ZnSe core/shell nanocrystals were replaced by 4-methoxythiophenol (Z-Y—SH thiol type ligand, where $Y=C_6H_4$ and $Z=OCH_3$: spectrum in FIG. 1C) (Example 6).

Another sample from the same batch of nanocrystals was treated with 4-dithiotoluic acid (Z-Y—C(S)SH dithiolate type, where $Y=C_6H_4$ and $Z=CH_3$; spectrum in FIG. 1D) (Example 5). Despite the much longer reaction time for the exchange with 4-methoxythiophenol compared to 4-dithiotoluic acid (70 h compared to 1.5 h), the replacement of the initial ligands (trioctyl phosphine oxide, trioctyl phosphine, hexadecyl amine) was not total. The important peaks in the NMR spectrum between 0.8 ppm and 1.8 ppm, due to the protons in the alkyl chains of these ligands, provide the proof. One also observes a disappearance of the peak of the —SH function ($\delta$=6.62 ppm) in the spectrum in FIG. 1D, which shows the deprotonation of 4-dithiotoluic acid during the bonding with the surface of the nanocrystal.

For the remainder, as already described, an excess of additional ligand was added to each of the two samples (see Example 7). The thiols were quickly replaced (after one hour) by dithiolate type ligands, as shown in particular by the absence of the proton peak of the methoxy group ($\delta$=3.7 ppm) in the NMR spectrum in FIG. 1E. In the opposite case, the exchange of ligands cannot be detected after 1 h and, even after a reaction time of 72 h, dithiolate type ligands remained on the surface of the nanocrystals, visible in particular thanks to the protons of the methyl group ($\delta$=2.3 ppm) in the NMR spectrum in FIG. 1F.

Example 8

In this example, photodegradation experiments were carried out to show the better stability under light beams of the nanocrystals covered by dithiolate type ligands (according to the invention) compared to nanocrystals covered by thiols.

For these experiments, the samples were in chloroform solution and had the same optical densities (0.1-0.5 of the excitonic peak) and therefore of identical concentration. They were placed in quartz bowls and continuously irradiated by a mercury vapour lamp (irradiation wavelengths 365 or 254 nm). The desorption of the ligands at the surface of the nanocrystals reduces their colloidal stability and leads to their precipitation. This was visible in the UV-visible absorption spectra, which where regularly recorded. The faster the signal decreases, the less stable the nanocrystals. The photodegradation was also visible by a shift of the excitonic peak towards the blue, which signifies a reduction in the average size of the crystals. A thiol with a long chain alkyl, 1-dodecanethiol, was chosen because it was this type of ligand that was the most resistant in the photodegradation experiments carried out by Aldana et al. (J. Am. Chem. Soc. 123(36), p. 8844-8850 (2001)). This ligand was compared to the 1-dithiotridecanoic acid prepared according to Example 3. Thus, the only difference between the two ligands X—Y-Z is the anchoring function X (thiol or dithiolate), whereas the Y-Z chemical groups are identical ($C_{12}H_{25}$)

FIG. 2A shows the spectra obtained for the samples of CdSe nanocrystals before the exchange of ligands at their surface, hereafter called basic crystals. After 33 h of irradiation at 365 nm, practically all of the nanocrystals were precipitated and the excitonic peak at around 570 nm was no longer visible in the spectrum. The ligands at the surface of the CdSe nanocrystals were exchanged by 1-dodecanethiol, as described in Example 6; NMR spectroscopy was used to ensure the exchange was complete. Under irradiation at 365 nm, the photodegradation time remained approximately the same: after 50 h, all of the crystals were precipitated (FIG. 2B).

A second sample from the same batch of nanocrystals was treated with 1-dithiotridecanoic acid, as described in Example 5, in order to completely cover the surface of the crystals by the dithiolate ligand. In this case, even after 67 h of irradiation, no precipitation of the nanocrystals took place, as shown by the presence of the excitonic peak in the spectra (FIG. 2C) and the absence of deposition on the walls of the quartz bowl containing the colloidal solution.

The use of higher energy light (254 nm) for the irradiation gave a shorter time scale for the degradation (1-2 h), however the nanocrystals covered by dithiolate type ligands again turned out to be more stable than the base crystals and the crystals covered by the thiols. In the case of CdSe/ZnSe core/shell nanocrystals, the same order of stability was observed for the CdSe crystals. Moreover, the fluorescence of CdSe/ZnSe crystals before exchange of the ligands and after exchange with the thiol rapidly decreased in less than 2 h of irradiation at 365 nm, whereas the CdSe/ZnSe crystals covered by dithiolate type ligands still fluoresced after 90 h without any change in the emission wavelength. This is a major advantage for applications that are based on the photoluminescence properties of the nanocrystals.

Example 9

In this example, a photochemical treatment was carried out on a sample of fluorescent nanocrystals covered by 1,1-dithiolate type ligands (according to the invention), in order to increase their fluorescence efficiency.

For this experiment, a quartz bowl containing a dispersion in chloroform of CdSe/ZnSe core/shell nanocrystals, treated with 1-dithiotridecanoic acid, prepared in an analogous manner to Example 5, was placed at a distance of 4 cm from a 100 W mercury vapour lamp.

The sample was then continuously irradiated at a wavelength of 365 nm.

FIG. 3 shows the evolution of the intensity of the fluorescence as a function of irradiation time. It reaches its maximum, which corresponds to around 8 times the initial value, after around 50 minutes. Continuing the exposure to UV light for a period in excess of around 100 minutes again resulted in a reduction in the fluorescence.

It should be noted that the wavelength and the width of the fluorescence band did not change during the irradiation.

The invention claimed is:

1. Nanocrystal comprising an inorganic core consisting of least one metal and/or at least one semi-conductor compound comprising at least one metal, the external surface of said nanocrystal being provided with an organic coating layer consisting of at least one ligand compound of formula (1):

$$X—Y-Z \qquad (I)$$

in which

X represents a 1,1-dithiolate or 1,1-diselenoate group that is linked by the two atoms of sulphur or selenium to an atom of metal of the external surface of said nanocrystal;

Y represents a spacer group capable of allowing a transfer of charge or an insulating group;

Z is a group chosen from among groups capable of communicating specific properties to the nanocrystal.

2. Nanocrystal according to claim 1 consisting of at least one metal.

3. Nanocrystal according to claim 1, in which the metal is chosen from among transition metals, rare earth metals, metals of groups IIIA, IVA and VA of the periodic table of elements, and alloys thereof, and mixtures of said metals and alloys.

4. Nanocrystal according to claim 1 comprising an inorganic core consisting of at least one semi-conductor compound.

5. Nanocrystal according to claim 1, in which the semi-conductor compound is a semi-conductor of formula AB in which A represents a metal or a non metal in oxidation state +II and B represents an element in oxidation state −II.

6. Nanocrystal according to claim 5, in which A is chosen from among Mg, Ca, Sr, Ba, Zn, Cd, Hg, Sn, Pb and mixtures thereof, and B is chosen from among O, S, Se, Te and mixtures thereof.

7. Nanocrystal according to claim 6, in which the semi-conductor of formula AB is chosen from among MgS, MgSe, MgTe, CaS, CaSe, CaTe, SrS, SrSe, SrTe, BaS, BaSe, BaTe, ZnO, ZS, ZnSe, ZnTe, CdS, CdSe, CdTe, HgS, HgSe, HgTe, SnS, SnSe, SnTe, PbS, PbSe, PbTe and mixtures thereof.

8. Nanocrystal according to claim 1, in which the semi-conductor compound is a semi-conductor of formula CD in which C represents a metal or a non metal in oxidation state +III and D represents an element in oxidation state −III.

9. Nanocrystal according to claim 8, in which C is chosen from among Ga, In and mixtures thereof and D is chosen from among Sb, As, P, N and mixtures thereof.

10. Nanocrystal according to claim 9, in which the semi-conductor of formula CD is chosen from among GaAs, GaSb, GaN, InGaAs, InN, InGaN, InP, InAs, InSb and mixtures thereof.

11. Nanocrystal according to claim 1, in which the semi-conductor compound is a group (IV) semi-conductor.

12. Nanocrystal according to claim 11, wherein the group (IV) semi-conductor is silicon or germanium.

13. Nanocrystal according to claim 1, which has a diameter of 15 to 150 Å.

14. Nanocrystal according to claim 1, further comprising one or several shells surrounding said core, said shells consisting of a layer of a metal and/or at least one semi-conductor compound comprising at least one metal.

15. Nanocrystal according to claim 14, in which the core has a diameter of 15 to 150 Å and the shell(s) has (have) a thickness of 3 to 30 Å.

16. Nanocrystal according to claim 1, in which the organic coating layer has a thickness of 5 to 100 Å.

17. Nanocrystal according to claim 1, in which Y corresponds to the following formula:

$$—R_1—R— \qquad (II)$$

where $R_1$ represents:

a single bond;

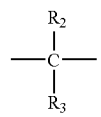

a group where $R_2$ and $R_3$ represent independently a hydrogen, an alkyl radical, an aryl radical, an alkoxy radical, a halogen;

A

group, where R' represents a hydrogen, an alkyl radical, an aryl radical, an alkoxy radical, a halogen;

A

group, where R' has the signification given above;

A

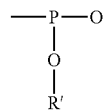

group, where R' has the signification given above;

—O—;
—S—;
—Se—;

and R represents a linear or branched alkylene group having from 1 to 30 carbon atom; one or several carbon atoms of said alkylene group may be optionally replaced by one or several heteroatoms chosen from among O, N, 5, P and Si; said alkylene group may optionally further comprise one or several double and/or triple bonds; and said alkylene group may be optionally further substituted by one or several groups chosen from among the halogens, heterocyclic rings, aryl, hydroxyl, alkoxy, amino, acyl, carboxamido radicals; =O; —CHO; —CO$_2$H; —SO$_3$H; —PO$_3$H$_2$; —PO$_4$H$_2$; NHSO$_3$H, sulphonamide; monoalkylamino, trialkyl ammonium or a dialkylamino radical, in which the two alkyl groups may form, jointly with the nitrogen atom of said dialkyl amino group, to which they are bonded, a cyclic ring that may be interrupted by one or several atoms of nitrogen, oxygen or sulphur, and the Z groups; or R represents a heterocyclic ring, an aryl radical, an aryl radical condensed on one or several other aryl rings and/or alkyl and/or heterocylic rings, a cycloalkyl radical, a cycloalkyl alkyl radical, an alkyl-cycloalkyl radical, an arylalkyl radical, an alkylaryl radical, a heterocycloalkyl radical or a alkyl-heterocycloalkyl radical.

18. Nanocrystal according to claim 17, in which Y represents an alkylene chain —(CH$_2$)$_n$—, where n=1 to 18, or an aromatic ring, which may be optionally substituted, or an alkoxy chain —[(CH$_2$)$_m$$^\Theta$O(CH$_2$)m]$_n$— where m=1 to 4 and n=1 to 6.

19. Nanocrystal according to claim 18, wherein the aromatic ring is

20. Nanocrystal according to claim 17, wherein R represents a linear or branched alkylene group having from 1 to 8 carbon atoms.

21. Nanocrystal according to claim 1, in which the Z group is chosen to obtain a solubility of the nanocrystals in a specific solvent defined by a given polarity.

22. Nanocrystal according to claim 21, in which the Z group is chosen among groups that enable the solubilisation of the nanocrystal in apolar solvents, and/or low polarity solvents.

23. Nanocrystal according to claim 22, wherein the low polarity solvents are hydrocarbons.

24. Nanocrystal according to claim 21, in which the Z group is chosen from among groups that enable the solubilisation of the nanocrystal in polar solvents.

25. Nanocrystal according to claim 24, wherein the polar solvents are water, alcohols, or mixture thereof.

26. Nanocrystal according to claim 1, in which the Z group is chosen from among groups that allow the nanocrystals to link with other molecules.

27. Nanocrystal according to claim 26, wherein the other molecules are biological molecules and conjugated polymers and oligomers.

28. Nanocrystal according to claim 1, in which the Z group contains conjugated polymers or oligomers or biological molecules.

29. Nanocrystal according to claim 1, in which the Z group is chosen from groups that allow the nanocrystal to link with one or several other nanocrystals.

30. Nanocrystal according to claim 1, in which the Z group is chosen from among hydrophilic groups, polar groups, and charged groups.

31. Nanocrystal according to claim 30, wherein the polar groups comprise hydroxyl groups, formyl groups, alkoxides, carboxylic acids, amines, and polyethers; and the charged groups comprise carboxylates, sulphonates, phosphates, nitrates, ammonium salts, and analogues thereof.

32. Nanocrystal according to claim 1, in which the Z group is identical to the X group.

33. Nanocrystal according to claim 1, in which several identical or different Z groups are present on the same ligand.

34. Nanocrystal according to claim 1, in which several X groups are present on the same ligand.

35. Nanocrystal according to claim 1, in which several ligands, which differ by the Y and/or Z group(s) that they contain, are present on the external surface of the same nanocrystal.

36. Nanocrystal according to claim 1, in which said nanocrystal is a fluorescent, photoluminescent nanocrystal.

37. Nanocrystal according to claim 36, in which said fluorescent photoluminescent nanocrystal has been subjected to an irradiation by a light.

38. Nanocrystal according to claim 37, in which said light is an ultraviolet light.

* * * * *